(12) United States Patent
Sjong

(10) Patent No.: US 9,783,647 B2
(45) Date of Patent: Oct. 10, 2017

(54) COMPOSITE FILMS AND METHODS FOR THEIR PRODUCTION

(71) Applicant: EMPIRE TECHNOLOGY DEVELOPMENT LLC, Wilmington, DE (US)

(72) Inventor: Angele Sjong, Louisville, CO (US)

(73) Assignee: Empire Technology Development LLC, Wilmington, DE (US)

( * ) Notice: Subject to any disclaimer, the term of this patent is extended or adjusted under 35 U.S.C. 154(b) by 545 days.

(21) Appl. No.: 14/282,055

(22) Filed: May 20, 2014

(65) Prior Publication Data

US 2015/0337092 A1 Nov. 26, 2015

(51) Int. Cl.
*C01B 31/04* (2006.01)
*C08J 5/18* (2006.01)
*H05K 1/03* (2006.01)

(52) U.S. Cl.
CPC .............. *C08J 5/18* (2013.01); *C01B 31/04* (2013.01); *C01B 31/0484* (2013.01); *H05K 1/0346* (2013.01); *H05K 1/0393* (2013.01); *C08J 2379/08* (2013.01); *H05K 2201/05* (2013.01); *Y10T 428/24802* (2015.01)

(58) Field of Classification Search
CPC ............ Y10T 428/24802; B82Y 30/00; H05K 1/0393; H05K 1/0346; C01B 31/0484
See application file for complete search history.

(56) References Cited

U.S. PATENT DOCUMENTS

| 8,110,026 | B2 | 2/2012 | Prud'Homme et al. |
| 9,017,474 | B2* | 4/2015 | Geim ..................... B82Y 30/00 106/287.28 |
| 2011/0303121 | A1* | 12/2011 | Geim ..................... B82Y 30/00 106/287.28 |

FOREIGN PATENT DOCUMENTS

| CN | 104193953 A | 12/2014 |
| WO | WO2010/123600 A2 | 10/2010 |

OTHER PUBLICATIONS

Sun et al. "Towards hybrid superlattices in graphene", Nature Comm., 2011, vol. 2, p. 559-562.*
International Search Report and Written Opinion for counterpart International PCT Application No. PCT/US2015/031676 dated Aug. 5, 2015.
Kuilla et al., Recent advances in graphene based polymer composites, *Progress in Polymer Science* (Jul. 27, 2010), 35:1350-1375.
Yan et al., Chemistry and physics of a single atomic layer: strategies and challenges for functionalization in graphene and graphene-based materials, *Chem. Soc. Rev.* (2012), 41:97-114.
Zhou et al., Graphene's cousin: the present and future of graphene, *Nanoscale Research Letters* (Jan. 13, 2014), 9(1):26-50.
Chang et al., Grafting Poly(methyl methacrylate) onto Polyimide Nanofibers via "Click" Reaction, *Applied Materials & Interfaces* (Dec. 10, 2009), 1(12):2840-2811.

(Continued)

*Primary Examiner* — Gerard Higgins
(74) *Attorney, Agent, or Firm* — Pepper Hamilton LLP

(57) ABSTRACT

A polymeric flexible substrate that meets the barrier requirements for oxygen and water, while exhibiting thermal stability or transparency may be formed from functionalized graphanes bonded with polymers.

20 Claims, 5 Drawing Sheets

(56) References Cited

OTHER PUBLICATIONS

Kim et al., Large-Scale Graphene Micropatters via Self-Assembly-Mediated Process for Flexible Device Application, *Nano Letters* (Jan. 25, 2012), 12:743-748.

Kogiso et al., Synthesis and Properties of Elastic Polyurethane-Imide, *Journal of Applied Polymer Science* (Aug. 27, 2009), 115:242-248.

Lebegue et al., Accurate electronic band gap of pure and functionalized graphene from GW calculations, *Physical Review B* (Jun. 17, 2009), 79:245117.1-245117.5.

NeXolve™ Technology for Today & Tomorrow, Essar™ Stretch 255 Polyimide, High temperature colorless elastic polymide, www.mantechmaterials.com, retrieved from the Web, no date available.

Pumera et al., Graphene and hydrogenated graphene, *Chem. Soc. Rev.* (2013), 42:5987-5995.

\* cited by examiner

COMPOSITE FILMS AND METHODS FOR THEIR PRODUCTION

BACKGROUND

Today's society has a seemingly ever-growing desire for portable electronic devices that are more robust, lightweight and versatile. One growing area of consideration for such products is the development of devices in a flexible form factor that can operate without deterioration in performance. In order for flexible displays and photovoltaics to be commercially successful, they should be robust enough to survive for the necessary time and conditions required of the device.

Beyond flexibility, printability and functionality of the components, other important requirements lie in making thermally stable materials that are less susceptible to interaction with many environmental components, such as oxygen and moisture. Some of the most difficult performance metrics to meet are the requirements for low permeability to water and oxygen ($10^{-6}$ g/m$^2$/day for H$_2$O and $10^{-5}$ g/m$^2$/day for O$_2$) and thermal stability (ideally up to 300° C.).

Substrates and barriers such as glass and metal provide excellent barriers to oxygen and moisture, but result in rigid devices that do not satisfy applications demanding flexible devices. On the other hand, plastic substrates and transparent flexible encapsulation barriers may be used, but these offer little protection to oxygen and water, resulting in devices that rapidly degrade.

A commercially available polyethylene naphthalate (PEN) film is only thermally stable up to about 200° C., and its permeability to oxygen and water is too high to meet the permeability requirements. Other commercially available flexible polyimide resin materials have very high thermal stabilities (about 350° C. to about 400° C.) but do not meet the permeability requirements.

Therefore, there remains a need for flexible barrier layer materials and flexible substrate layer materials that meet the required permeability parameters for oxygen and water, while also being compatible with high-temperature processing or integrated functionality.

SUMMARY

A polymeric flexible substrate is provided that can meet the barrier requirements for oxygen and water without sacrificing thermal stability or transparency. The flexible polymeric composite may be optically transparent, may be thermally stable above 300° C., may have low oxygen and water permeability of less than about $10^{-6}$ g/m$^2$/day, and may be formed into sheets that may be less than about 10 micron thickness.

In an embodiment, a composite film includes functionalized graphane bonded with a polymer, wherein the graphane is functionalized with at least one functional group configured to bond with the polymer.

In an embodiment, a method for producing a composite film of a polymer and a functionalized graphane, includes functionalizing graphane with at least one functional group configured to interact with the polymer, and integrating the functionalized graphane with the polymer.

In an embodiment, an electronic device includes a printed circuit board, and the printed circuit board includes at least one substrate sheet of functionalized graphane bonded with a polymer and one or more electronic components disposed on the at least one substrate sheet. The graphane is functionalized with at least one functional group configured to bond with the polymer.

DETAILED DESCRIPTION

A flexible polymeric material that can meet the barrier requirements for oxygen and water without sacrificing thermal stability or transparency, may include a graphene insulator, alternately known as graphane, or chemically-hydrogenated graphene. Graphane, when prepared by chemical hydrogenation, has a large band gap exceeding 4 eV, classifying it as an electrical insulator. The Fermi energy gap of graphane depends on the level of hydrogenation, and graphane obtained by chemical hydrogenation, such as by the Birch Reduction, has a large band gap, and in addition may be liquid-based. A graphane-polymer composite may be non-conductive due to the high hydrogenation of the graphene, may have low impermeability to water and oxygen, and may be thermally stable to create a flexible substrate/barrier for electronics.

Figure 1:
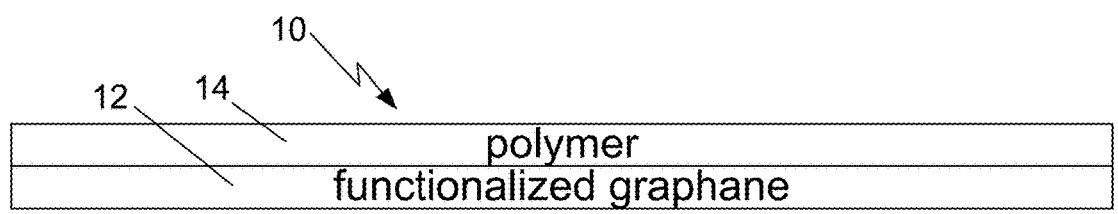
FIG. 1 depicts a general representation of a composite graphane-polymer according to an embodiment.
Figure 2A:
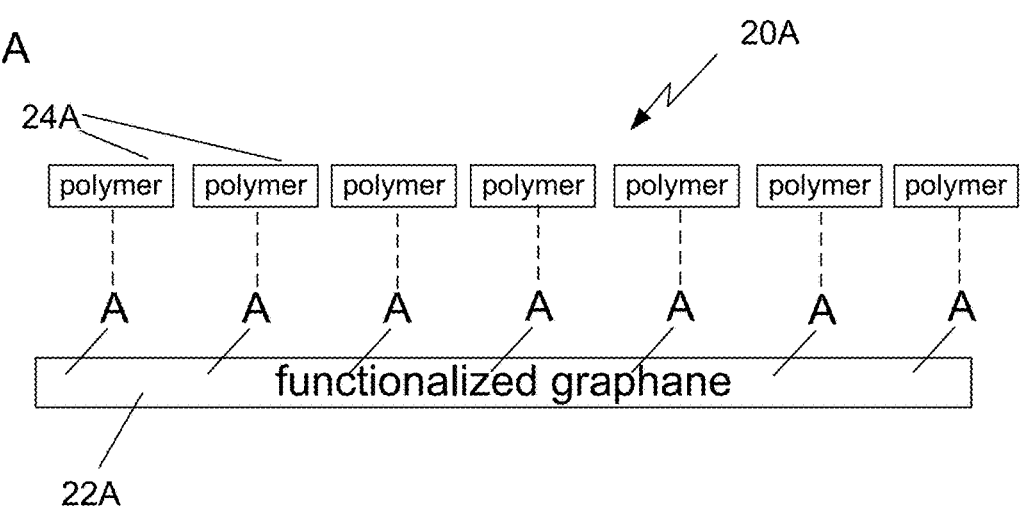
FIGS. 2A and 2B depict general representations of composite sheets according to embodiments.
Figure 2B:
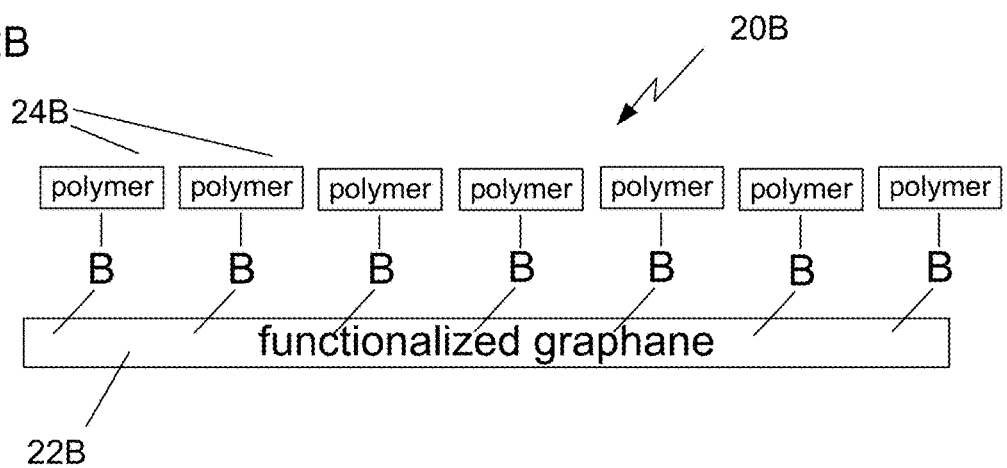

In an embodiment as generally represented in FIG. 1, a composite film 10 may include functionalized graphane 12 bonded with a polymer 14. As represented in FIGS. 2A and 2B, the graphane 22A or 22B may be functionalized with at least one functional group A or B that is configured to bond with the polymer 24A or 24B. In an embodiment as represented in FIG. 2A, the functional group A may be configured to non-covalently bond with the polymer 24A by hydrogen bonding, Van der Waals forces, electrostatic forces, π-π interactions, or a combination thereof (as represented by the dashed vertical lines). In an alternative embodiment as represented in FIG. 2B, the functional group B may be configured to covalently bond with the polymer 24B (as represented by the solid vertical lines).

Figure 3:
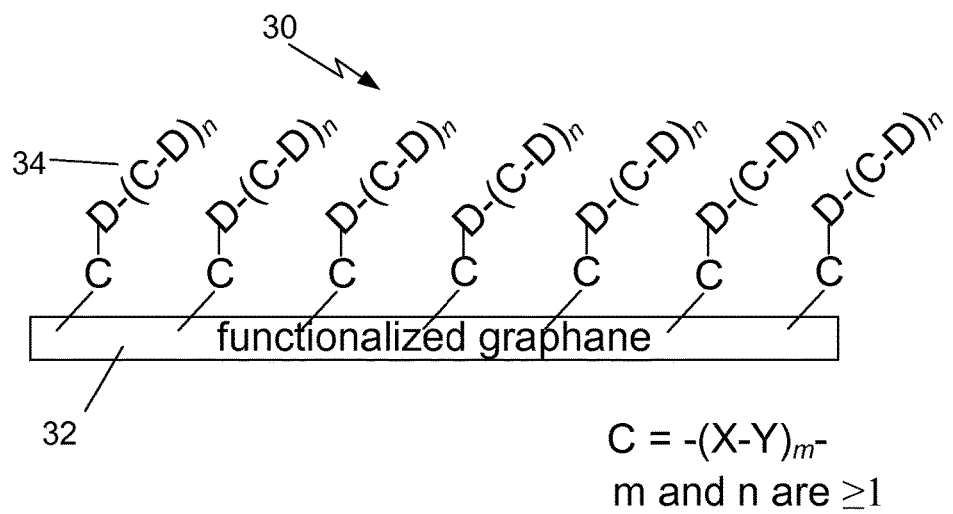
FIG. 3 provides an alternative depiction of a composite sheet of functionalized graphane polymerized with a polymer according to an embodiment.

Polymers are composed of repeating monomer units. The monomer units may all be the same, or the polymer may include several different monomer units. In one embodiment, as represented in FIG. 3, the functional group C of the graphane 32 may be the same as one of the monomer units C or D of the polymer 34. The functional group of the graphane may be polymerized with the monomers of the polymers.

Some examples of functional groups may include, but are not limited to, aryl, polystyrene, pyrene, porphyrin, thiophene, methacrylate, polystyrene, polyacrylamide, polyvinyl alcohol, polycaprolactone, epoxy, and polyvinylidine fluoride, or any combination thereof. Some examples of polymers may include, but are not limited to, nylon, polyvinyl chloride, polystyrene, polyethylene, polypropylene, polycarbonate, poly(diallyldimethylammonium chloride) (PDDA), polyvinyl alcohol, polycaprolactone, and polymers with terminal carboxylic acid groups, or any combination thereof.

To provide a flexible substrate, the polymer may be an elastomer. Some examples of elastomers may include, but are not limited to, polyamides, polyimides, polyesters, polyurethanes, polyolefins, poly(ester imide ethers), butadienes, silicones, and acrylics, or any combination thereof. In one embodiment, the graphane may be functionalized with elastomeric polyimide groups for incorporation into polyimide elastomer film, such as, for example, a polyurethane-polyimide. A graphane-polyimide elastomer may have the following properties:
  very low permeability to water—less than about 10-6 g/m2/day;
  very low permeability to oxygen—less than about 10-5 g/m2/day;
  transparency requirements—greater than about 85% transmittance, less than about 0.7% haze, and transparent from about 400 nm to about 700 nm;
  electrically insulating—a band gap of at least about 4 electron volts;
  sheet thickness—greater than about 10 microns, and may extend up to about several mm; and
  thermal stability—greater than about 300° C.

Such a composite would be usable as an electrically insulating substrate for electronic components, such as a substrate for printed circuit boards. An electronic device may include a printed circuit board, and the printed circuit board may include at least one substrate sheet and one or more electronic components disposed on the at least one substrate sheet to provide a printed circuit assembly. The substrate sheet may include functionalized graphane bonded with a polymer, wherein the graphane may be functionalized with at least one functional group configured to bond with the polymer. Electronic components may include, but are not limited to a microprocessor, a diode, a microcontroller, an integrated circuit, a capacitor, a resistor, a transformer, an inductor, and a logic device, or any combination thereof.

In an embodiment, the functional group and the polymer may each be a polyurethane. Polyurethane polymers typically are formed from di- or polyisocyanate monomers polymerized with polyol monomers. The functional group of the graphane may be a first polyurethane that has at least first and second monomer units, and the polymer may be a second polyurethane that has at least third and fourth monomer units. Returning to the representation depicted in FIG. 3, the first polyurethane C functionalizing the graphane 32 may be one of the monomer units (C, D) of the second polyurethane (the polymer 34).

The first polyurethane C may include a first monomer unit X derived from a polyisocyanate, and a second monomer unit Y derived from a polyol, so that the first polyurethane may be structurally represented by $-[XY]_m-$, wherein $m \geq 1$. The use of the wording derived from is meant to indicate that one compound is a starting compound for making another compound via one or more method steps, for example, a polyisocyanate is a starting compound for making X, and thus X is derived from a polyisocyanate.

The second polyurethane may include a third monomer unit C that may be the first polyurethane, and a fourth monomer unit D that includes at least one carbonyl group. The second polyurethane may be structurally represented by $-[D-C]_n-$ or alternatively $-[D-[XY]_m]_n-$, wherein $n \geq 1$. For the second polyurethane, at least a portion of the C monomer units may be provided by the functional groups of the graphane to integrally interconnect the graphane with the polymer.

Figure 4:
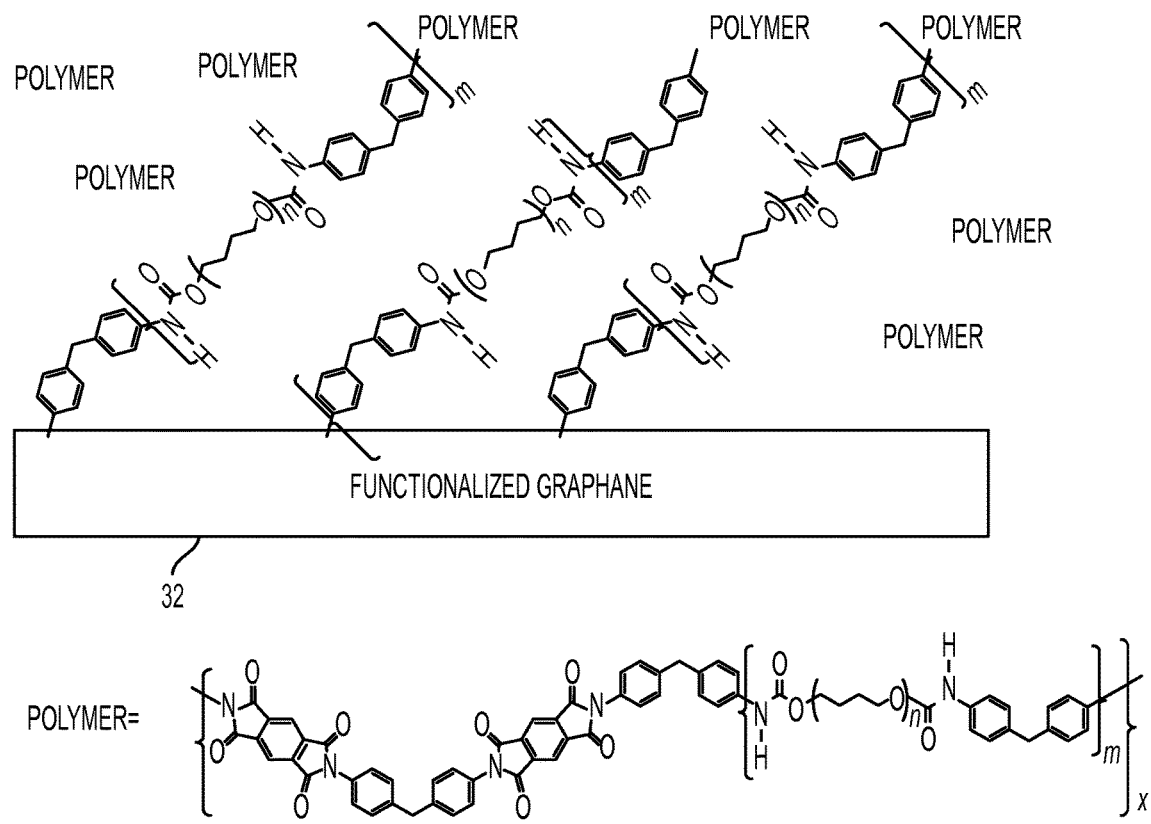
FIG. 4 provides an alternative representation of a composite sheet of functionalized graphane polymerized with a polymer according to an embodiment.

As an example, as represented in FIG. 4, the at least one functional group of the graphane, monomer unit C or alternatively $-[XY]_m-$, may be a polyurethane as structurally represented by

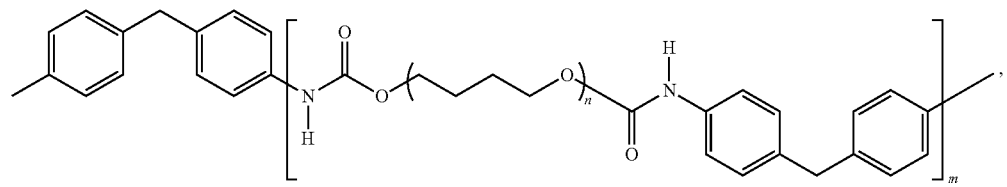

wherein n and m are each, independently, greater than or equal to 1. The polyurethane-polyimide (polymer in FIG. 4), $-[D-C]_n-$ or $-[D-[XY]_m]_n-$, may be structurally represented by

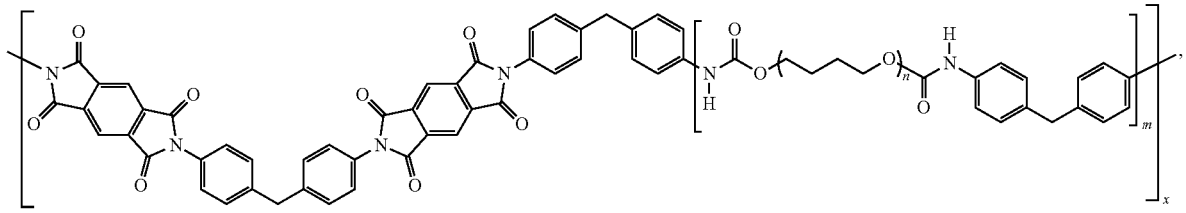

where n, m and x are each, independently, greater than or equal to 1. In the polyurethane-polyimide, at least a portion of the

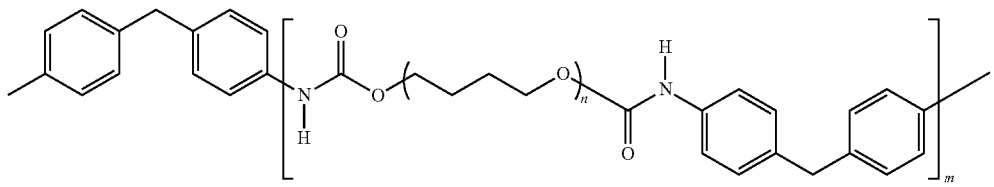

units, may be functional groups of the graphane.

Figure 5:
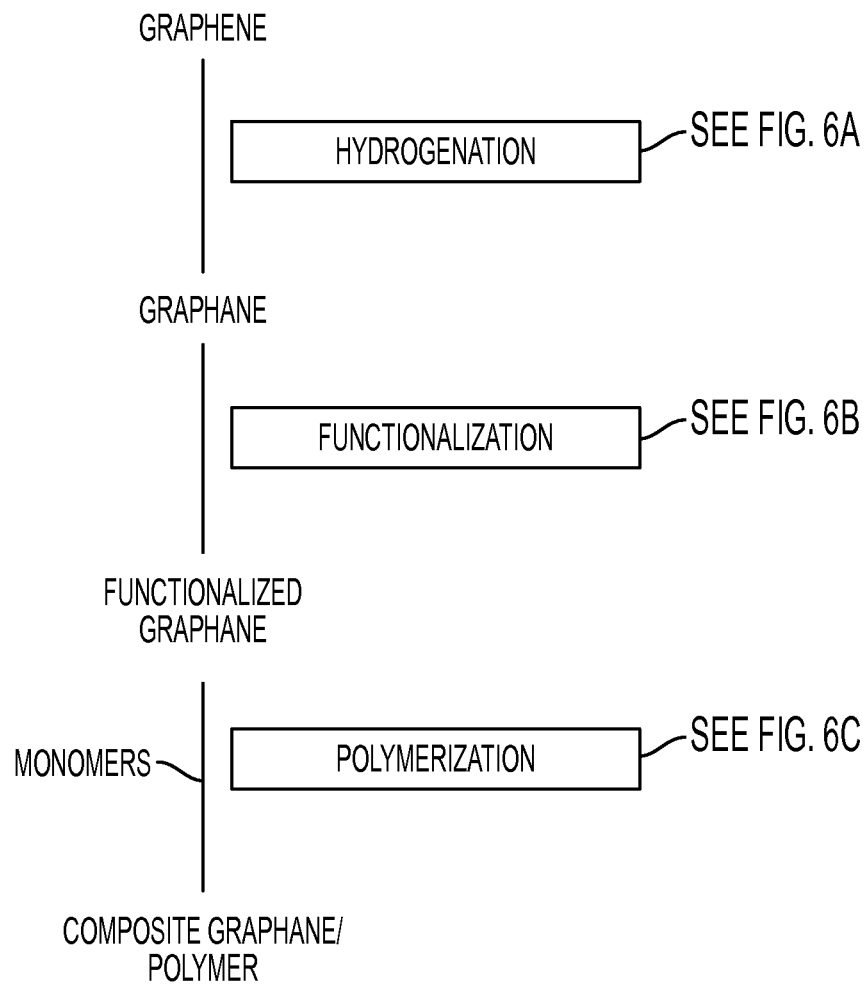
FIG. 5 depicts an illustrative method for producing a composite graphane-polymer according to an embodiment.
Figure 6A:
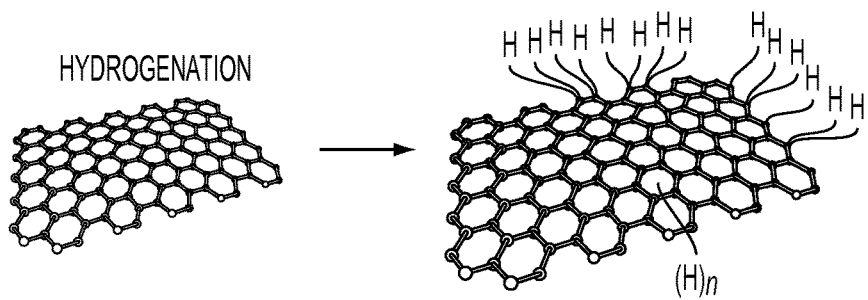
FIGS. 6A-6C provide additional method details for reaction steps as depicted in FIG. 5.

As represented in FIGS. 5 and 6A, electrically insulating graphane may be produced by hydrogenation of graphene. One method for hydrogenation of graphene is by Birch Reduction (lithium in liquid ammonia) of graphite. The Birch reduction gives a highly reduced, exfoliated product that is free of lithium, and both edge and interior hydrogenation have been demonstrated by solid-state $^{13}C$ NMR spectroscopy. Elemental analysis of carefully purified samples of the hydrogenated graphene shows a chemical composition that may be expressed as $(C_{1.3}H)_n$. Atomic force microscopy images show that the reduced graphene is highly exfoliated, and hydrogen mapping by electron energy loss spectroscopy shows that the entire surface of the reduced sample is covered by hydrogen, consistent with the NMR studies, and also indicating that hydrogen was added in interior positions of the graphene lattice as well as along the edge. The measured band gap of 4 eV further establishes the high level of hydrogenation.

Alternatively, another method for hydrogenation of graphene, or production of graphane, may include exposing CVD-grown graphene films on Cu foil to hydrogen plasma at low and high frequency at 1.5 Torr pressure. Other hydrogenation methods may also be used. The hydrogenation of graphene is essentially irreversible under the conditions that might be needed for processing as a substrate sheet. Dehydrogenation and a return to pristine graphene essentially requires a temperature of about 500° C. for about 30 minutes to about 45 minutes in a vacuum, much more aggressive processing conditions than the temperatures of about 300° C. to about 350° C. for processing flexible electronics.

The graphane (hydrogenated graphene) may be used for producing a composite film or substrate material. FIG. 5 further depicts a general method for producing a composite of a polymer and a functionalized graphane that may include functionalizing graphane with at least one functional group configured to interact with the polymer, and integrating the functionalized graphane with the polymer. The at least one functional group may include aryl, polystyrene, pyrene, porphyrin, thiophene, methacrylate, polystyrene, polyacrylamide, polyvinyl alcohol, polycaprolactone, epoxy, or polyvinylidine fluoride, or a combination thereof.

Figure 6B:
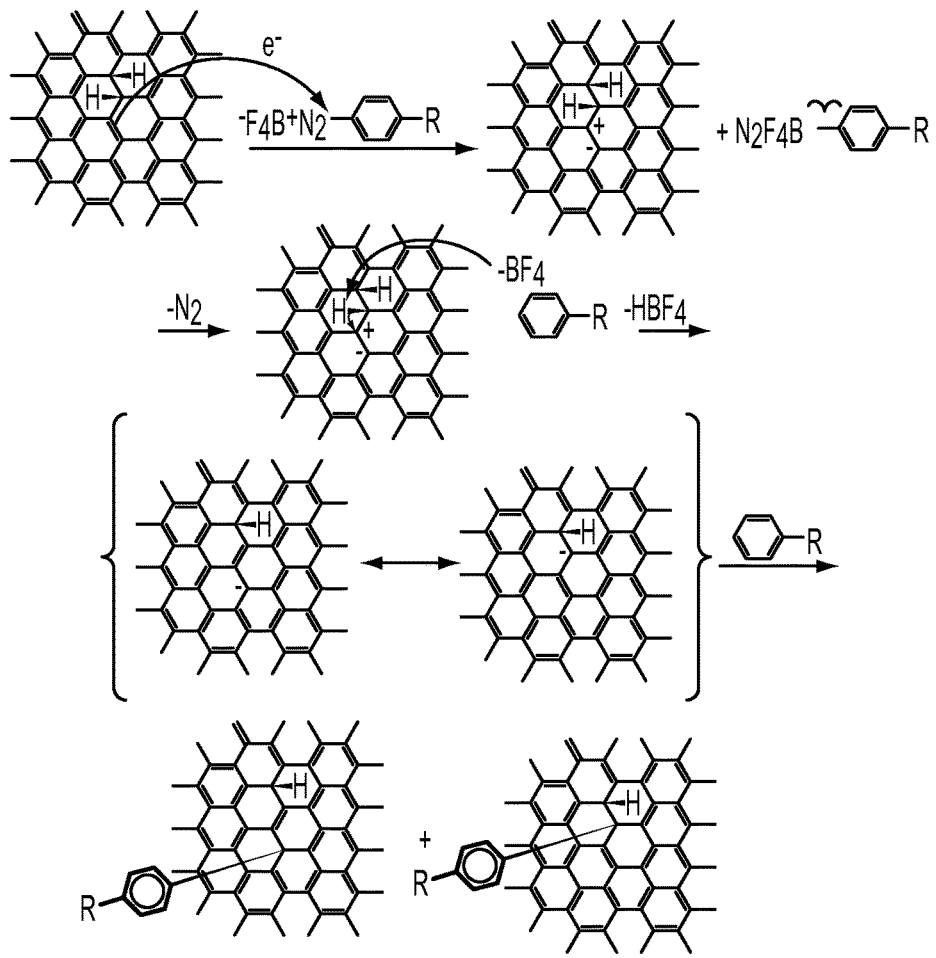

After hydrogenation of graphene, the resultant graphane may have an increased reactivity at the C—C bonds. As represented in FIGS. 5 and 6B, in an embodiment, graphane may be functionalized by exposing the graphane to at least one diazonium aryl salt to covalently bond aryl functional groups of the diazonium aryl salt to the graphane. Upon exposure to the diazonium salt, a proton may be eliminated from the graphane to form $HBF_4$, a graphane radical and a free aryl radical. The free aryl radical may attack the graphane surface to form an sp3 C—C bond. The diazonium aryl salt may include the at least one functional group for functionalizing the graphane to thereby covalently bond the functional group to the graphane.

The diazonium aryl salt may have a structure as represented by $^-F_4B$ $^+N_2$—X, wherein X is aryl. Alternatively, the diazonium aryl salt may have a structure as represented by

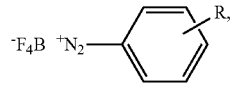

wherein R may be selected from the group consisting of hydrogen, alkyl alkenyl, alkynyl, alkoxy, alkoxyalkyl, fluoroalkyl, hydroxyalkyl, cycloalkyl, bicycloalkyl, heterocycloalkyl, heteroaryl, aryl, cycloalkylalkyl, heteroarylalkyl, arylalkyl, or any combination thereof. In addition, R may also be a molecular component that contains a primary amine group, for example —$CH_2NH_2$, that may react with PMDA, or R may be a molecular component that contains an alcohol group, such as —$CH_2OH$, for reaction with an isocyanate group in the prepolymer.

As generally represented in FIG. 5, the functionalized graphane may be integrated with a polymer. In an embodiment, the method of integrating the functionalized graphane may include disposing the functionalized graphane adjacent the polymer to non-covalently bond the functionalized graphane with the polymer. Non-covalently bonding may include bonding the functionalized graphane with the polymer by hydrogen bonding, Van der Waals forces, electrostatic forces, π-π interactions, or a combination thereof.

Figure 6C:
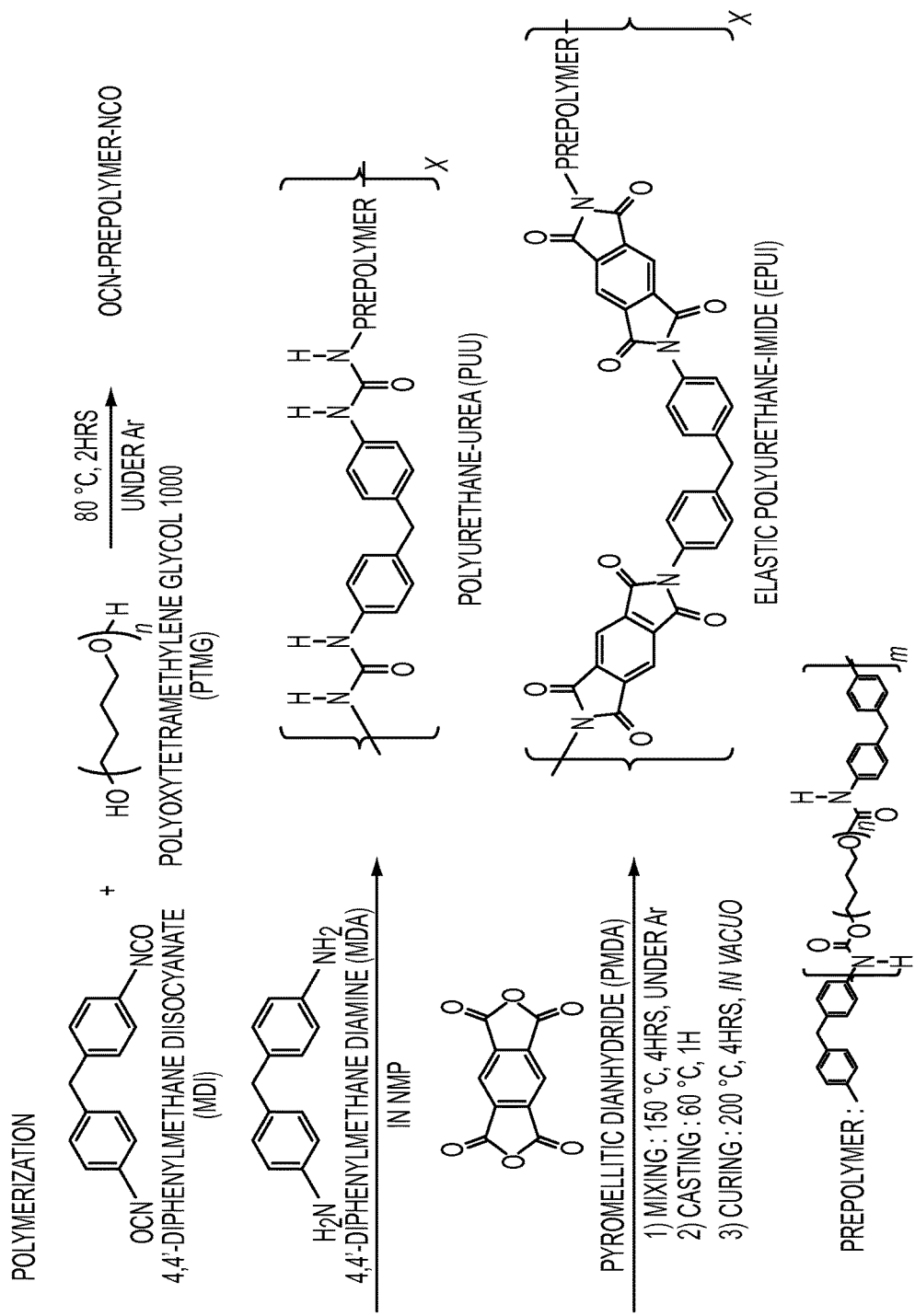

As represented in FIGS. 5 and 6C, in an embodiment, the method of integrating the functionalized graphane may include forming at least a portion of the polymer with the at least one functional group. The at least one functional group may be a first polymeric monomer, and integrating the functionalized graphane may include polymerizing the first polymeric monomer of the functional group with at least one additional monomer. In this manner, a polymer may be covalently bonded with the graphane. In addition to the graphane functionalized with the first polymeric monomer, an additional portion of first polymeric monomer may be mixed with the at least one additional monomer to form a monomer mixture. The monomer mixture may be applied to the functionalized graphane where polymerization of the at least one additional monomer with both the first polymeric monomer in the mixture and with the first polymeric monomer of the functional group may occur.

The at least one functional group may be configured as a prepolymer and the graphane may be functionalized with the prepolymer. The prepolymer may be configured to have a structural unit as represented by $-[XY]_m-$, wherein $m \geq 1$, X is derived from a polyisocyanate, and Y is derived from a polyol. The polyisocyanate may include, but is not limited to 4,4'-diphenylmethane diisocyanate, toluene diisocyanate, 4,4'-dicyclohexamethane diisocyanate, naphthalene 1,5-diisocyanate, or 1,3-phenylene diisocyanate, or a combination thereof, and the polyol may include, but is not limited to, polyoxytetramethylene glycol, ethylene glycol, 1,3-propane diol, 1,4-butane diol, 1,6-hexane diol, neopentyl glycol, propylene glycol, 1,3-butane diol, or trimethylpentane diol, or a combination thereof.

For integration of the functionalized graphane and a polymer, a polymer may be formed which incorporates the prepolymer of the functionalized graphane. The polymer may have a structural unit as represented by $-[D-[XY]_m]_x-$, wherein $m \geq 1$, $x \geq 1$, D may be at least one additional monomeric functional group. At least a portion of the $-[XY]_m-$ of the polymer may be provided by the prepolymer of the graphane, thereby attaching the polymer to the graphane. In addition, D may be a component having an imide bond or a diphenyl group.

In an embodiment, the at least one functional group may be a prepolymer having a structure

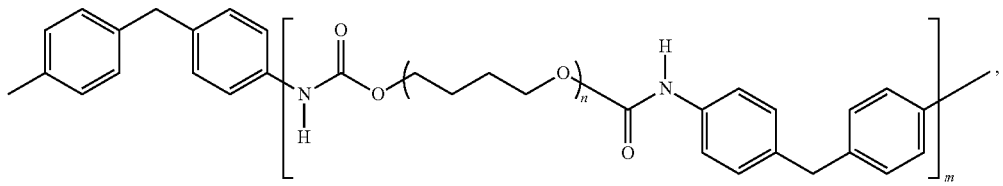

wherein n and m are each, independently, greater than or equal to 1, and graphane may be functionalized with the prepolymer. A corresponding polyurethane-polyimide polymer may be configured to have a structure as represented by

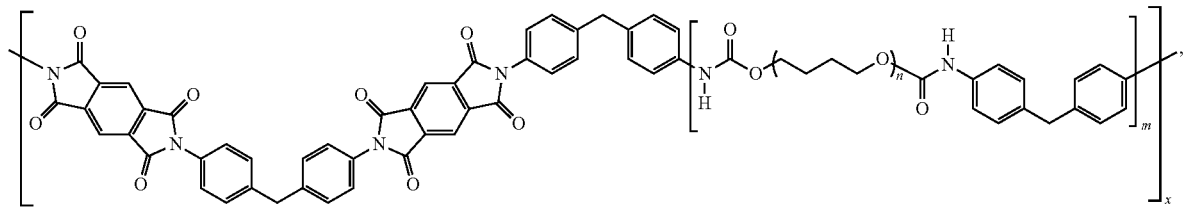

where n, m and x are each, independently, greater than or equal to 1. With this configuration, the at least one functional group of the graphane may be polymerized into the polymer so that at least a portion of the

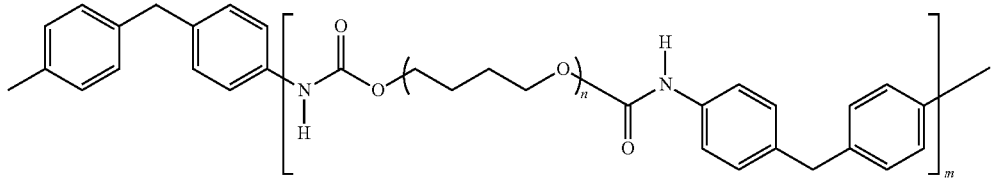

component of the polyurethane-polyimide may be the functional group of the graphane thereby integrating the polymer with the functionalized graphane.

As represented in FIG. 6C, integrating the functionalized graphane with the polymer may include producing a prepolymer by reacting 4,4'-diphenylmethane diisocyanate with polyoxytetramethylene glycol 1000 to form a diisocyanate prepolymer having a structure

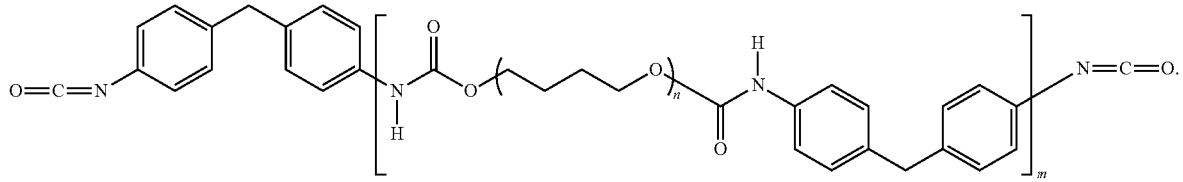

The prepolymer of the functionalized graphane and the diisocyanate prepolymer may be reacted with 4,4'-diphenylmethane diamine to form a polyurethane-urea having a polymeric structure

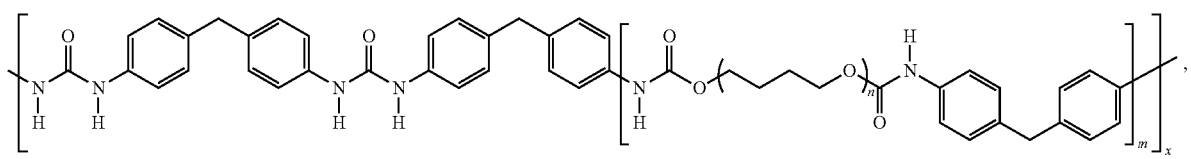

wherein at least a portion of the

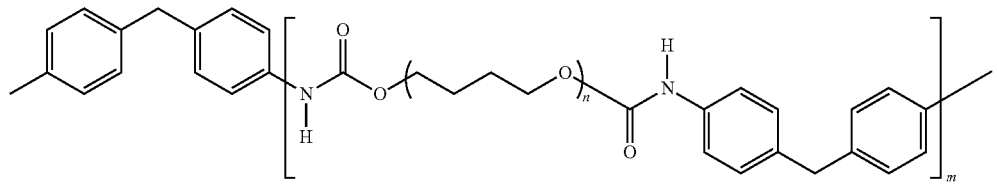

component of the polyurethane-urea may be the prepolymer of the graphane. This may be carried out by applying a mixture of the diisocyanate prepolymer and 4,4'-diphenyl-methane diamine to the functionalized graphane.

The polyurethane-urea may be reacted with pyromellitic dianhydride to form an elastic polyurethane-imide having a polymeric structure of

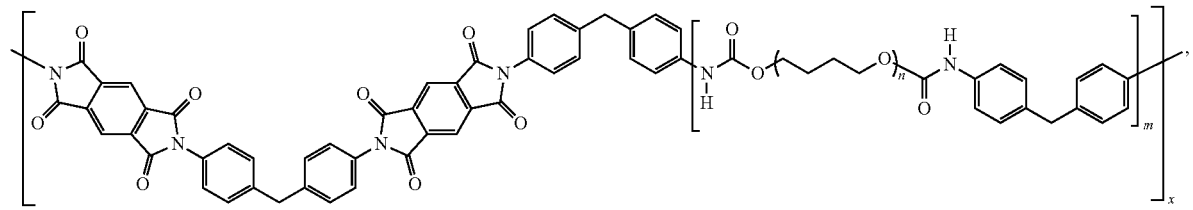

where n, m and x are each, independently, greater than or equal to 1.

The application of the monomer mixture to the graphane and the corresponding polymerization may be carried out as an evaporation-induced, self-assembly process. For large scale production, the monomer mixture may be applied to a surface of a roller, and the monomer mixture may be transferred from the surface of the roller to a surface of the functionalized graphane.

EXAMPLES

Example 1: A Flexible Composite Insulating Sheet

Flexible heat-resistant sheets having a thickness of about 10 microns will be produced. The sheets will include functionalized graphane integrated with an elastic-polyurethane-imide. The graphane will be functionalized with an aryl prepolymer of formula

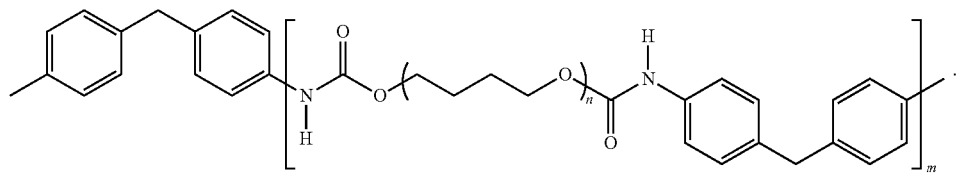

The prepolymers of the functionalized graphane will be polymerized with a mixture of additional monomers, and a resultant polymer of structure

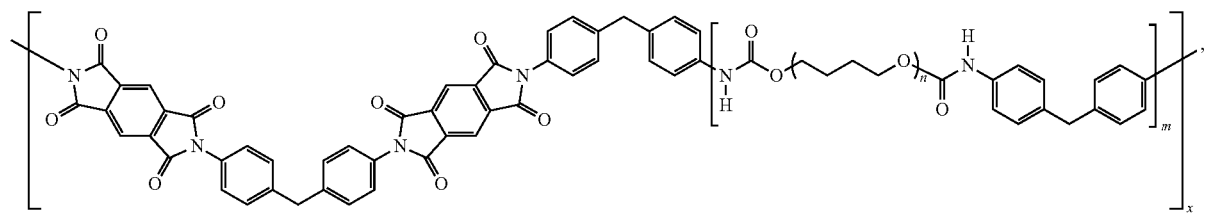

where n, m and x are each, independently, greater than or equal to 1, will covalently bind with the functionalized graphane to provide a composite sheet.

Example 2: Production of Graphane-Polymer Composite Sheets

Graphene sheets will be hydrogenated via a Birch Reduction as represented in FIG. 6A to produce graphane sheets.

A diazonium aryl salt having a structure as represented by $^-F_4B\ ^+N_2$—X, wherein X has an aryl component structurally represented by

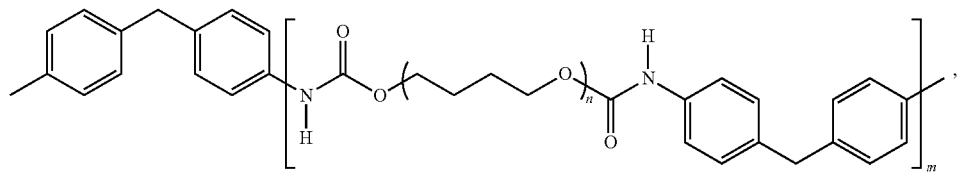

will be applied to graphane sheets, wherein as represented in FIG. 6B, a proton may be eliminated from the graphane to produce $HBF_4$, a graphane radical, and a free aryl radical. The free aryl radical will attack the graphane surface to bond the aryl component with the graphane sheet to produce a functionalized sheet as represented in FIG. 4 (without the polymer presence).

Structurally similar diisocyanate monomers having a formula of

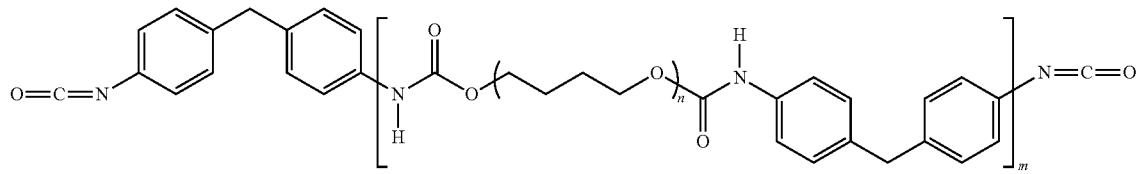

will be produced by reacting 4,4'-diphenylmethane diisocyanate with polyoxytetramethylene glycol 1000 at about 80° C. in an Argon atmosphere for about 2 hours. The aryl prepolymer of the functionalized graphane and the diisocyanate prepolymer may be polymerized by applying a mixture of the diisocyanate prepolymer and 4,4'-diphenylmethane diamine to the functionalized graphane to form a polyurethane-urea having a polymeric structure of

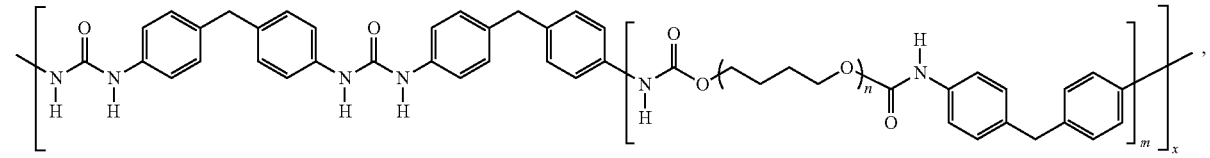

wherein at least a portion of the

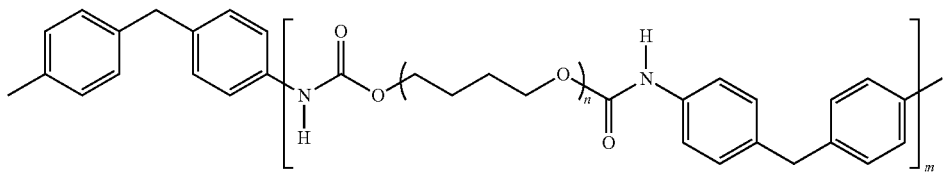

component of the polyurethane-urea will be the prepolymer of the graphane. This may be carried out by applying a mixture of the diisocyanate prepolymer and 4,4'-diphenyl-methane diamine to the functionalized graphane.

Uncured polyurethane-urea will be reacted with pyromellitic dianhydride at about 150° C. under an argon atmosphere for about 4 hours to form an elastic polyurethane-imide bound with the graphane and having a polymeric structure of

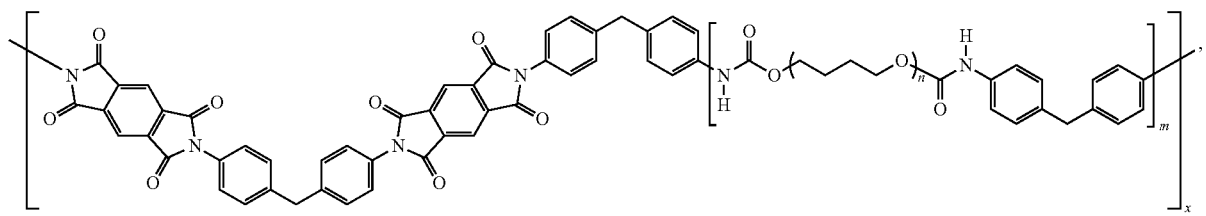

where n, m and x are each, independently, greater than or equal to 1. The resultant polymer will be cured at about 200° C. for about 4 hours under vacuum.

The composite polyurethane-imide-graphane will be formed into sheets having a thickness of about 10 microns.

Example 3: Printed Circuit Assemblies

Five sheets of Examples 1 and 2 will be printed with electrically conductive traces. The sheets will be stacked to produce printed circuit boards, and the circuit boards will be fitted with electronic components such as microprocessors, diodes, microcontrollers, integrated circuits, capacitors, resistors, transformers, inductors, and logic devices to provide flexible printed circuit assemblies.

Example 4: Permeability

The graphane-polymer composite sheets of Example 2 are expected to be impermeable to both oxygen and water based on the permeability of similar products. For example, graphene is widely known to be impermeable, and since graphane is hydrogenated graphene, graphane-polymer composite sheets are therefore expected to have comparable permeability.

Example 5: Thermal Stability

The graphane-polymer composite sheets of Example 2 are expected to have good thermal stability based on the thermal stability of similar products. For example, graphane may be heated at temperatures of about 500° C. for 30-45 minutes in a vacuum to cause the graphane to return to pristine graphene. In addition, a thermogravimetric analysis of polyurethane-polyimide composite showed a 10% weight loss temperature (T10) of about 340° C. Thermal decomposition studies of the graphene of a polyimide-graphene nanocomposite were found to show an increase in thermal decomposition with increasing graphene content. A thermal decomposition ($T_d$) value of 504° C. was measured for the neat polyimide, whereas $T_d$ values for all of the graphene polyimide nanocomposites were higher and increased with increasing graphene content. The addition of both surface-modified graphene and unmodified graphene resulted in improvements in the thermal stability. Based on the thermal decomposition of graphene and composites of graphene and polyimide, it may be reasonably expected that the graphane-polymer composite sheets of Example 2 will also have good thermal stability.

The examples demonstrate that flexible composite sheets having improved oxygen and moisture impermeability and improved thermal stability may be produced by functionalizing graphane. Such sheets may be useful for the production of flexible electronic devices that can operate without deterioration in performance due to environmental conditions.

This disclosure is not limited to the particular systems, devices and methods described, as these may vary. The terminology used in the description is for the purpose of describing the particular versions or embodiments only, and is not intended to limit the scope.

In the above detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:

1. A composite film comprising an aryl functionalized graphane covalently bonded with a polymer.

2. The composite film of claim 1, wherein the polymer comprises nylon, polyvinyl chloride, polystyrene, polyethylene, polypropylene, polycarbonate, poly(diallyldimethylammonium chloride) (PDDA), polyvinyl alcohol, polycaprolactone, terminal carboxylic acid groups, or any combination thereof.

3. The composite film of claim 1, wherein the polymer comprises a functional group that covalently bonds with the aryl functionalized graphane, and wherein the aryl functionalization of the aryl functionalized graphane and the polymer each comprises a polyurethane.

4. The composite film of claim 3, wherein the aryl functionalization of the aryl functionalized graphane comprises a first polyurethane comprising at least first and second monomer units, and the polymer comprises a second polyurethane comprising at least third and fourth monomer units, wherein at least one of the third and fourth monomer units comprises the first polyurethane.

5. The composite film of claim 4, wherein:
the first monomer unit X is derived from a polyisocyanate, the second monomer unit Y is derived from a polyol, and the first polyurethane comprises a structural unit as represented by -[XY]$_m$-, wherein m≥1; and
the third monomer unit Z comprises at least one carbonyl group, the fourth monomer unit comprises the first polyurethane, and the second polyurethane comprises a structural unit as represented by -[Z-[XY]$_m$]$_x$-, wherein x≥1.

6. The composite film of claim 5, wherein at least a portion of the fourth monomer unit comprises the first polyurethane.

7. The composite film of claim 3, wherein the polymer comprises a polyurethane-polyimide.

8. The composite film of claim 7, wherein the aryl functionalization of the aryl functionalized graphane comprises

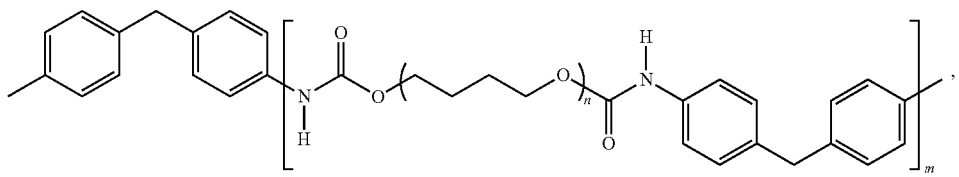

wherein n and m are each, independently, greater than or equal to 1.

9. The composite film of claim 8, wherein the polyurethane-polyimide has a structure as represented by

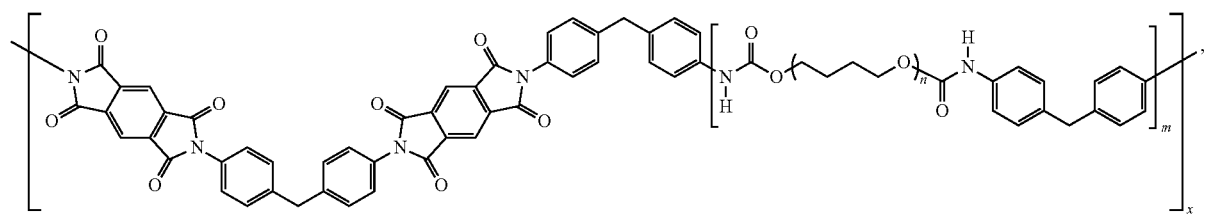

where n, m, and x are each, independently, greater than or equal to 1.

10. The composite film of claim 9, wherein at least a portion of the

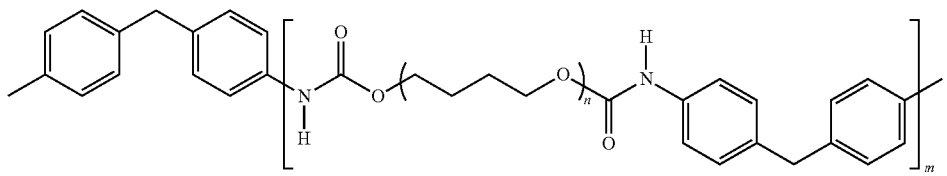

component of the polyurethane-polyimide is the same as the aryl functionalization of the aryl functionalized graphane.

11. The composite film of claim 1, wherein the composite film has a thermal stability greater than about 300° C.

12. The composite film of claim 1, wherein the composite film has an oxygen permeability of less than about $10^{-5}$ g/m²/day.

13. The composite film of claim 1, wherein the composite film has a water permeability of less than about $10^{-6}$ g/m²/day.

14. The composite film of claim 1, wherein the composite film has a band gap of at least about 4 electron volts.

15. A method for producing a composite film comprising a polymer covalently bonded with an aryl functionalized graphane, the method comprising:
functionalizing graphane with an aryl group that can interact with the polymer; and integrating the aryl functionalized graphane with the polymer, wherein the aryl functionalized graphane covalently bonds with the polymer.

16. The method of claim 15, wherein functionalizing the graphane comprises exposing the graphane to at least one diazonium aryl salt to covalently bond aryl functional groups of the diazonium aryl salt to the graphane.

17. The method of claim 15, wherein:
functionalizing the graphane comprises:
forming a prepolymer, wherein the aryl group comprises the prepolymer, the prepolymer having a structural unit as represented by -[XY]$_m$-, wherein m≥1, X is derived from a polyisocyanate, and Y is derived from a polyol; and
functionalizing the graphane with the prepolymer; and
integrating the aryl functionalized graphane with the polymer comprises:
covalently bonding the polymer with the aryl functionalized graphane, the polymer having a structural unit as represented by -[Z-[XY]$_m$]$_x$-, wherein m≥1, x≥1, Z comprises at least one additional monomeric functional group, and at least a portion of the -[XY]$_m$- of the polymer is the same as the prepolymer of the aryl functionalized graphane.

18. The method of claim 15, wherein functionalizing the graphane comprises:
forming a prepolymer having a structure

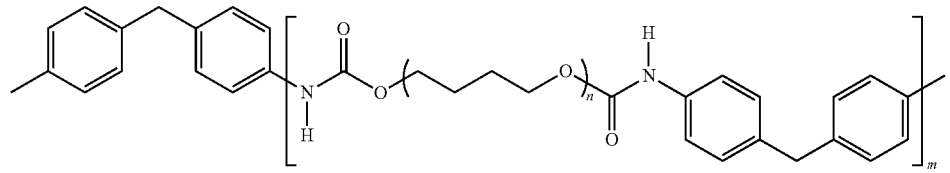

as the aryl group; and functionalizing the graphane with the prepolymer.

19. The method of claim 18, wherein integrating the aryl functionalized graphane with the polymer comprises:
reacting 4,4'-diphenylmethane diisocyanate with poly-oxytetramethylene glycol to form a diisocyanate prepolymer having a structure

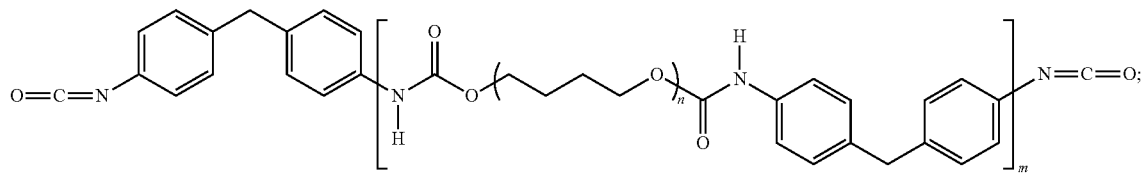

reacting the prepolymer of the aryl functionalized graphane and the diisocyanate prepolymer with 4,4'-diphenylmethane diamine to form a polyurethane-urea having a polymeric structure of

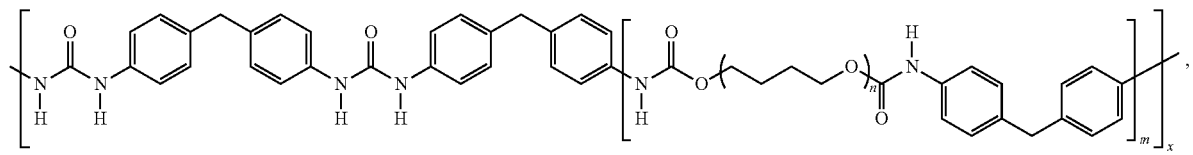

wherein at least a portion of the

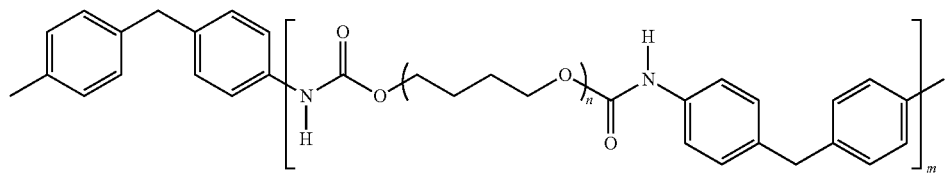

component of the polyurethane-urea is the same as the prepolymer of the graphane; and
reacting the polyurethane-urea with pyromellitic dianhydride to form an elastic polyurethane-imide having a polymeric structure of

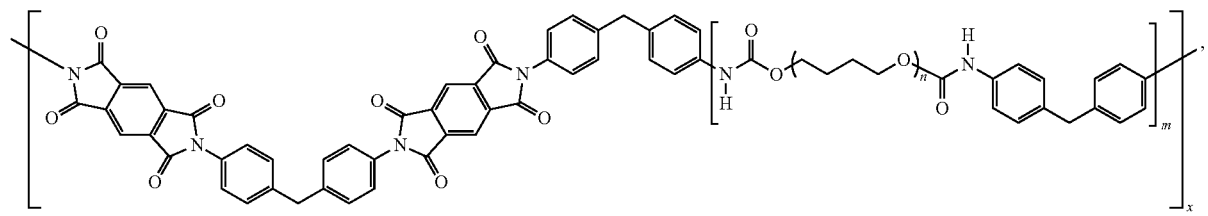

where n, m, and x are each, independently, greater than or equal to 1.

20. An electronic device comprising a printed circuit board, wherein the printed circuit board comprises:
at least one substrate sheet comprising aryl functionalized graphane covalently bonded with a polymer; and
one or more electronic components disposed on the at least one substrate sheet.

* * * * *

UNITED STATES PATENT AND TRADEMARK OFFICE
CERTIFICATE OF CORRECTION

PATENT NO. : 9,783,647 B2
APPLICATION NO. : 14/282055
DATED : October 10, 2017
INVENTOR(S) : Sjong Page 1 of 1

It is certified that error appears in the above-identified patent and that said Letters Patent is hereby corrected as shown below:

In the Specification

In Column 6, Line 16, delete "alkyl alkenyl," and insert -- alkyl, alkenyl, --, therefor.

In Column 7, Line 67, delete "structure" and insert -- structure of --, therefor.

In Column 9, Line 1, delete

" 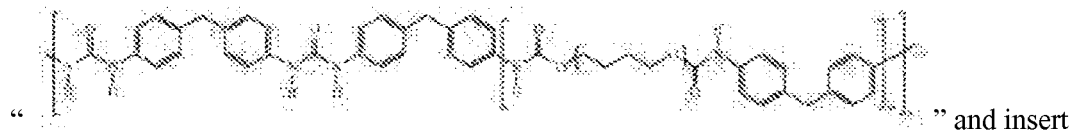 " and insert

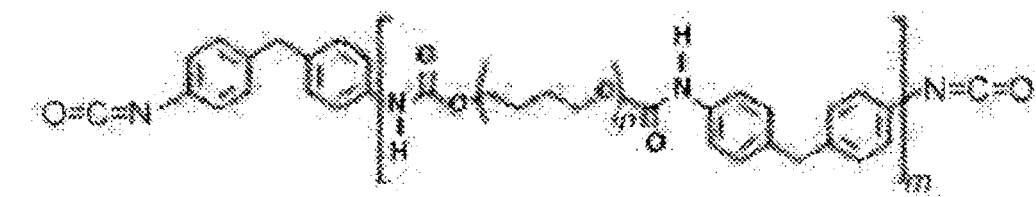

--, therefor.

Signed and Sealed this
Third Day of July, 2018

Andrei Iancu
*Director of the United States Patent and Trademark Office*